United States Patent [19]

Bergh

[11] Patent Number: 4,791,522
[45] Date of Patent: Dec. 13, 1988

[54] SHORT CIRCUIT PROTECTOR FOR OUTPUT CIRCUITS HAVING SERIES-CONNECTED TRANSISTORS

[75] Inventor: Sven H. Bergh, Rönninge, Sweden

[73] Assignee: Telefonaktiebolaget L M Ericsson, Stockholm, Sweden

[21] Appl. No.: 65,393

[22] Filed: Jun. 23, 1987

[30] Foreign Application Priority Data

Jul. 4, 1986 [SE] Sweden ................................ 8603000

[51] Int. Cl.$^4$ .............................................. H02H 3/08
[52] U.S. Cl. ......................................... 361/93; 361/98
[58] Field of Search ....................... 361/88, 91, 93, 98, 361/100, 111, 54, 56, 57; 307/200 B, 473, 475, 548, 549, 550, 553, 554

[56] References Cited

U.S. PATENT DOCUMENTS

| | | | |
|---|---|---|---|
| 3,447,035 | 5/1969 | Boykin | 361/92 |
| 3,648,071 | 3/1972 | Mrazek | 307/237 |
| 3,749,936 | 7/1973 | Bell | 307/202 |
| 3,786,364 | 1/1974 | Wheatley, Jr. | 330/207 |
| 4,020,395 | 4/1977 | Erikson et al. | 361/111 X |
| 4,495,536 | 1/1985 | Bynum | 361/111 X |
| 4,580,063 | 4/1986 | Torelli et al. | 361/91 X |
| 4,581,672 | 4/1986 | Lucero | 361/56 X |
| 4,678,950 | 7/1987 | Mitake | 361/91 X |
| 4,686,383 | 8/1987 | Croft | 361/56 X |
| 4,706,159 | 11/1987 | Hafner | 361/93 |

FOREIGN PATENT DOCUMENTS

| | | |
|---|---|---|
| 0083504 | 7/1983 | European Pat. Off. . |
| 0091203 | 10/1983 | European Pat. Off. . |
| 2947062 | 6/1980 | Fed. Rep. of Germany . |
| 3103852 | 2/1982 | Fed. Rep. of Germany . |
| 55178 | 5/1979 | Japan ................................ 361/91 |

Primary Examiner—M. H. Paschall
Assistant Examiner—A. Jonathan Wysocki
Attorney, Agent, or Firm—Burns, Doane, Swecker & Mathis

[57] ABSTRACT

The invention relates to overload and short circuit protectors for electrical circuits with two series connected output stage transistors (MP10, MN10) or the like, the conductive capacity of which is controlled complementally such as to generate on an output (10) between the output stage transistors an output signal with a potential varying in response to the potential of an input signal. In a circuit with overload or short circuit protectors in accordance with the invention there is included at least one protective circuit including two protection transistors (MN6, MN46) or the like, of which one (MN6) has its conductive capacity substantially determined by the potential on the circuit output (OUT), the conductive capacity of the second (MN46) protection transistor being substantially in response to the input signal. The protective circuit is coupled into the circuit with its transistors connected in series so that it achieves a substantial change in the conductive capacity of at least one (MN10) of the output stage transistors if, and only if, both series connected protection transistors of the protective circuit become conductive simultaneously.

12 Claims, 3 Drawing Sheets

SHORT CIRCUIT PROTECTOR FOR OUTPUT CIRCUITS HAVING SERIES-CONNECTED TRANSISTORS

TECHNICAL FIELD

The present invention relates to short circuit protectors in electrical circuits. The invention is primarily intended for output stages having two series connected transistors, the conductive capacity of which is controlled complementally such as to generate on an output between the transistors an output signal with a potential varying in response to the potential of an input signal. However, the invention is also applicable to certain other circuits, with an output between two series connected components with controllable conductive capacity, for limiting damaging currents through the components in case of a certain kind of short circuit or too low ohmic load on the outputs. The invention is particularly suitable for realization in integrated circuits of the MOS type, both NMOS as well as CMOS.

BACKGROUND ART

It is well known in different fields to provide the output stages in electrical circuits with short circuit and overload protection of different kinds. With respect to output stages including two series connected transistors with the output between the transistors, it is known to have short circuit or overload protection for one or both transistors controlled by the potential on the output between them. It is also pertinent to the prior art to limit the current through the transistor in the output stage in connection with short circuiting or overloading by activating the input signal in a final stage in a current-decreasing direction with the aid of transistors and feedback. It is also known, per se, to have series connected transistors in short circuit or overload protectors, the conductive capacity of the transistors being directly or indirectly controlled by input signals to, or output signals from a circuit which is to be protected.

Short circuit and/or overload protection for series connected transistors in different fields which may be of interest in connection with the present invention will be apparent from e.g. the following publications: U.S. Pat. No. 3,447,035, U.S. Pat. No. 3,648,071, U.S. Pat. No. 3,749,936, U.S. Pat. No. 3,786,364, DE No. 2947062, DE No. 3103852, EP No. 0083504 and EP No. 0091203.

SUMMARY OF THE INVENTION

It is an old and well-known problem that certain types of electrical circuit can be destroyed or seriously damaged by short circuiting, and that output stages in amplifiers etc. can be damaged by overloading. It has thus been known for a long time to equip electrical circuits with short circuit and/or overload protection.

In circuits with two series connected output stage transistors or the like components, supplied with current at a high and a low feed voltage and arranged to generate a signal at an output between the transistors, this output signal having a potential responding to an input signal to the circuit, it is desirable that an overload and short circuit protector can protect both transistors (a) for overload, (b) for short circuiting of the output to the high feed voltage, (c) for short circuiting of the output to the low feed voltage.

At least in certain fields, it is also desirable that the short circuit and overload protection does not limit the potential difference which can be achieved on the output by different types of complemental control of the conductivity state of both transistors. In certain cases it is also important that the overload and short circuit protection does not load the signal source supplying the circuit input signals, e.g. by short circuiting or lowering the input impedance of the circuit input.

It is of course a desire that the short circuit protection and overload protection are selective, i.e. that they come into operation only during a short-circuiting or overloading situation. In short circuit protection for circuits with two series connected transistors of the kind mentioned above, which are complementally controlled into different conductive states, all short circuiting situations do not always have the consequence of damage to the transistors. Depending on which transistor is turned on or off, and whether the short circuit takes place to the high or low feed voltage, the short circuit state can at least temporarily be more or less damaging, nor even ot cause any immediate risk of the damage to one of the transistors In certain cases, it may then be a desire that the short circuit protection does not come into operation at such "no danger" short circuits.

So far, it has been a problem to provide short circuit and overload protection for circuits of the kind in question, where the protection satisfies all the abovementioned desires while at the same time being functionally reliable as well as cheap and simple to achieve, not least in connection with integrated circuits, e.g. those made using MOS technique. The present invention has the object of solving this problem.

Somewhat summarily and simplified, the present invention can be said to be based on the use of at least one circuit or stage including two controllable components, preferably two series connected transistors. The protective circuit or stage is coupled into the circuit to be protected so that the conductive capacity of one of the controllable components is substantially controlled by the potential on the output of the circuit to be protected, with the conductive capacity of the second controllable component substantially depending on the input signal to the circuit to be protected. In addition, the protective circuit or stage is coupled into the circuit to be protected so that it achieves a substantial change in the conductive capacity of one of the output stage transistors or the like component, if, and only if, both transistors or the like of the protective circuit or stage become conductive simultaneously. Due to the coupling of the protective switch transistors into the rest of the circuit and not least to the output stage transistor, they will be conductive simultaneously only for an overload or short circuit of a kind damaging to the output stage transistor or the like. A protective circuit or stage is preferably arranged for each output stage transistor or the like, as well as a control stage for each protective circuit or stage.

Distinguishing for a circuit with the short circuit and/or overload protection in accordance with the invention is more correctly expressed by the main claim, while the subordinate claims disclose what is particularly distinguishing for certain preferred embodiments of the invention. Among the advantages of a circuit in accordance with the invention, apart from its simple construction and suitability for integrated circuits produced according to different techniques, there may be mentioned the very selective triggering of the short circuit protector and/or the overload protector, and also that a circuit in accordance with the invention can be supplied with current having only two different feed voltages, of which one can be at ground potential. Furthermore, the circuit is well suited to the cases where its input impedance should not be affected. Since non current-sensing resistors in series with the output stage transistors are required, the output signal amplitude is not restricted by the short circuit protector. Further advantages will be understood by one skilled in the art, after having studied the description of preferred embodiments.

DESCRIPTION OF THE PREFERRED EMBODIMENTS

Figure 1:
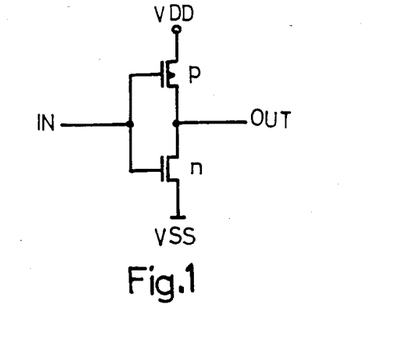
FIG. 1 illustrates a known output stage with two different series connected output stage components having controllable conductive capacity.

FIG. 1 illustrates a known transistor stage in CMOS technique with a p-channel transistor coupled in series with an n-channel transistor. The stage has an input IN connected to both transistors, and an output OUT connected between the transistors. When the potential on the input is sufficiently high in relation to the feed voltages VDD and VSS, the n-channel transistor is on and the p-channel transistor is off. When the potential on the input is sufficiently low in relation to the feed voltages, the p-channel transistor is on instead, and the n-channel transistor is off. Due to one transistor being of the p-channel type and the other of the n channel type, the conductivity of both transistors can be controlled complementally directly via a common input IN.

Figure 2:
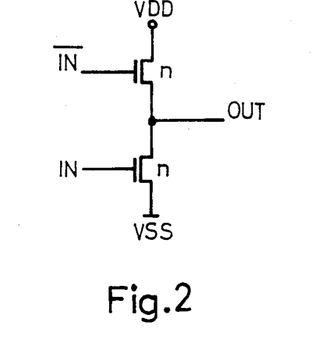
FIG. 2 illustrates a known alternative output stage with two principly alike series connected output stage components with controllable conductive capacity.

FIG. 2 illustrates a known transistor stage in NMOS technique with two principally alike series connected n-channel transistors. The stage has an output OUT connected between the transistors. Due to both transistors being of the same type, their conductivity cannot be controlled complementally directly via a common input. The stage in FIG. 2 therefore has in principle two inputs, IN and $\overline{\text{IN}}$ intended for complemental input signals, i.e. when the potential on one transistor input IN is comparatively low, and the potential on the other input $\overline{\text{IN}}$ shall be comparatively high, and vice versa.

Figure 3:
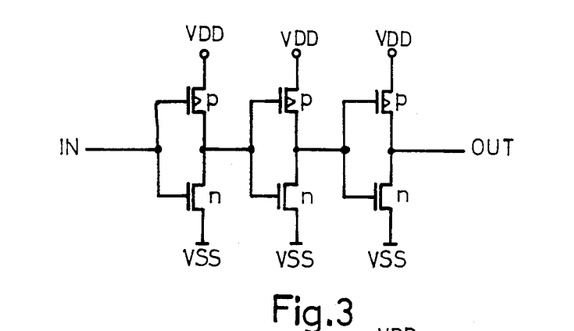
FIG. 3 illustrates a circuit in the form of an output stage in FIG. 1 with associated control stage or buffer stage.
Figure 4:
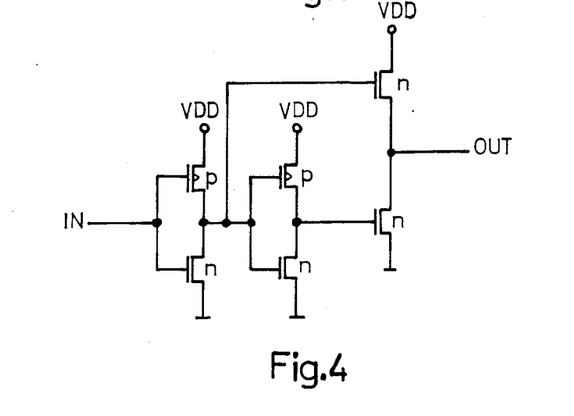
FIG. 4 illustrates an alternative circuit in the form of the output stage in FIG. 2 with associated control stage or buffer stage.

When at least one transistor stage according to FIGS. 1 or 2 is implemented as an output stage with the capacity of supplying a comparatively high output current or output power, a buffer or control stage is generally required to generate suitable input signals to the output stage, these signals coming from logical circuits in MOS technique. FIGS. 3 and 4 illustrate examples of how to drive an output stage according to FIGS. 1 or 2 with the aid of buffer or control stages.

The circuit in FIG. 3 has an input IN and an output OUT and three apparently alike cascade connected transistor stages, each of which is in principle of the same type as in FIG. 1. Actually, however, the transistors are normally dimensioned differently, the transistors in the output stage, i.e. the transistor stage nearest the output being the greatest. The cascade connection enables the load on the signal to be small simultaneously as the circuit can drive a large output current.

The circuit in FIG. 4 has an input IN and an output OUT and two cascade connected control or buffer stages. Since both the series connected transistors, of the same type in the output stage, shall have complementally varying control signals to obtain complementally varying conductivity, the upper transistor in the output stage is coupled directly to the first buffer or control stage output, while the lower transistor in the output stage is coupled directly to the second buffer or control stage output.

If an output stage according to FIGS. 1 or 2, included, for example, in a circuit according to FIGS. 3 or 4, is allowed to drive a load other than the one it is dimensioned for, or its output is short-circuited to one or another of the feed voltages, i.e. the high VDD or the low VSS, of which one can be ground potential, or to another feed voltage for a circuit coupled to the output OUT, there is a risk that in response to the input signal potential one of the transistors in the output stage will be subjected to a current, which is considerably greater than the maximum permitted, and this can permanently damage the transistor. Whether some transistor is damaged, and if so which one, depends on (a) how the load is made up and connected, or to what feed voltage the output OUT is short circuited, and (b) on the input signal potential during the short circuit or to the load coupled in. In favourable cases no permanent damage is caused to any transistor. However, if the input signal on the circuit input IN has a potential such that it strives to control the conductivity of the output stage transistors so that the output is given a high potential simultaneously as the output is short circuited to the lower feed voltage VSS, which is usually negative or ground potential, or an even lower feed voltage for another circuit connected to the output OUT, the current through the conductive transistor in the output stage can be too great, so that the conductive transistor is permanently damaged. The corresponding situation applies if the input signal has a potential such that it strives to control the conductivity of the output stage transistors so that the output is given a low potential simultaneously as the output is short circuited to the high feed voltage VDD or to a high feed voltage for another circuit coupled to the output OUT. On the other hand, the risk of permanent damage to the transistor in the output stage is considerably less, or even non-existant, if the input signal has a potential such that it strives to control the conductivities of the output stage transistors so that the output OUT is given a high potential, simultaneously as the output is short circuited to the high feed voltage. In a corresponding manner, the risk is less, or in favourable cases non-existent, if the input signal has a potential such that it strives to control the conductivities of the output stage transistors so that the output OUT is given a low potential simultaneously as the output is short circuited to the low feed voltage. For a too low ohmic load coupled between the output OUT and a high or low feed voltage, the risks of damage are similar to those in short circuiting, but they decrease with increasing load resistance The embodiments of short circuit protected circuits according to the invention, which are illustrated in FIGS. 5 and 6, are based on this knowledge of the damage risks.

Figure 5:
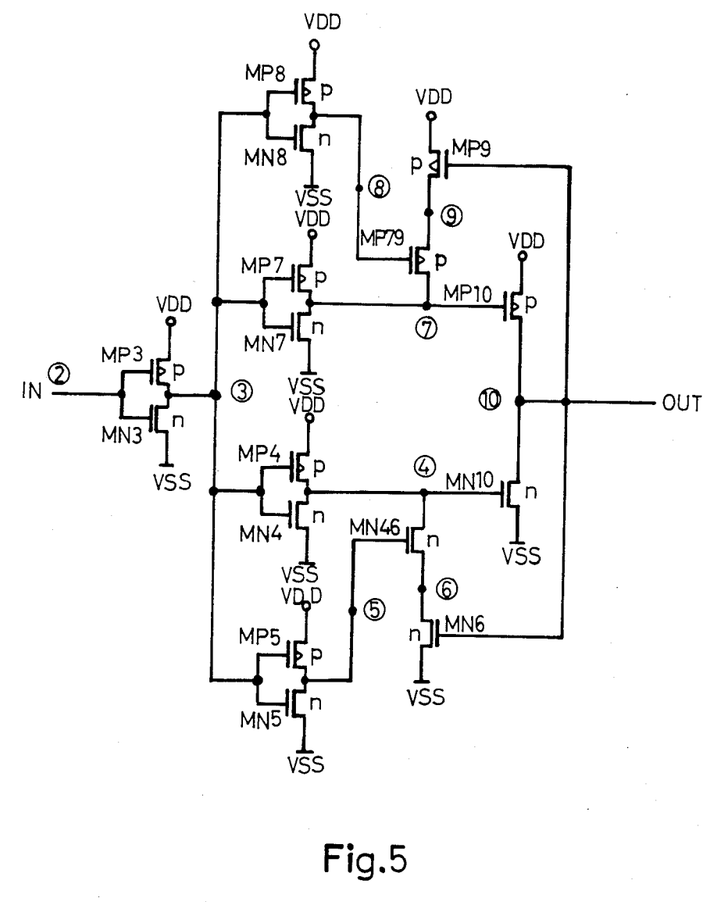
FIG. 5 illustrates a circuit protected against short circuit in accordance with the invention, including an output stage according to FIG. 1 with partially separate control stage or buffer stage for the two series connected output stage components, as well as two protective circuits and two further control stages.
Figure 6:
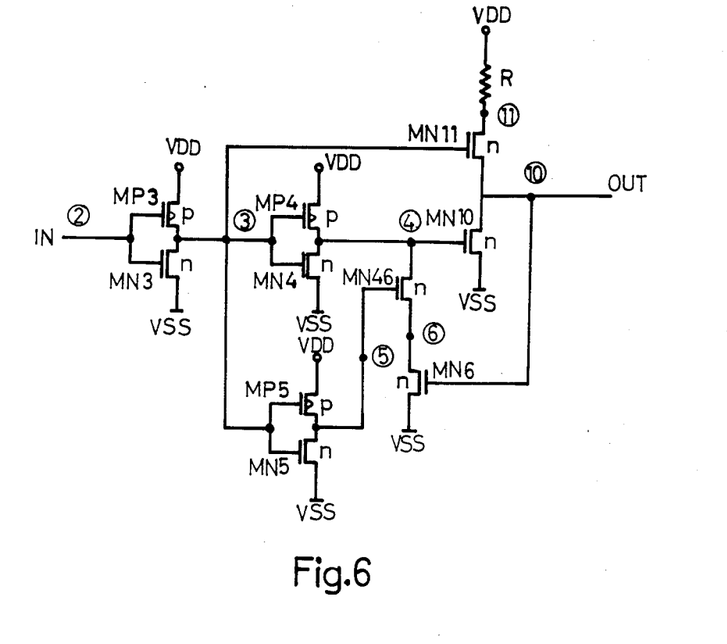
FIG. 6 illustrates an alternative circuit protected against short circuit in accordance with the invention, including an output stage according to FIG. 2 with associated control stage or buffer stage according to FIG. 4, as well as a current limiting resistor, a protective circuit and a further control step.

The short circuit protected circuit illustrated in FIG. 5 includes an output stage with two series connected output stage components in the form of the transistors MP10 and MN1. A circuit output OUT is connected to a point 10 between the series connected transistors in the output stage. A circuit input IN is connected at a point 2 to both the transistors MP3 and MN3 in an input stage. For controlling the conductivity of the transistor MN10 there is a first buffer or control stage including transistors MP4 and MN4 connected between the output 3 of the input stage and the control electrode of the transistor MN10. For controlling the conductivity of the transistor MP10 there is a second buffer or control stage including transistors MP7 and MN7 coupled between the input stage output 3 and the control electrode of the transistor MP10. It may be said of the first and second control stages that together they replace the central stage of the three cascade connected stages in the circuit in FIG. 3. The input stage, both control stages and the final stage in the circuit in FIG. 5 are also arranged such that, during normal operation without short circuiting or incorrect load, they function together in principly the same way as the three stages in the circuit in FIG. 3. Remaining components, i.e. transistors, in the circuit in FIG. 5 all have in principle the task of providing overload and short circuit protection for the transistors in the output stage.

The overload and short circuit protector for the transistor MN10 includes: (a) a first protective circuit or switch with two protective switch components in the form of protection transistors MN6 and MN46, (b) a first further control stage with two control stage transistors MP5 and MN5. Both protection transistors MN6 and MN46 in the first protective switch are connected in series between the low feed voltage VSS and the connection between the first control stage output and the control input electrode of the transistor MN10 at 4. The first further control stage functions in principle in the same way as the first control stage, and has its control stage input connected to the input stage output at 3, and its control stage output connected at 5 to the control electrode of the transistor MN46. The control electrode of the transistor MN6 is connected to the output stage output at 10.

The overload and short circuit protector for the transistor MP10 includes; (a) a second protective circuit or switch with two controllable protective switch components in the form of transistors MP9 and MP79, (b) a second further control stage with two control stage transistors MP8 and MN8. The second further control stage functions in principle in the same way as the second control stage, and has its control stage input connected to the output of the input stage at 3, and its control stage output connected at 8 to the control electrode of the transistor MP79. Both protection transistors MP9 and MP79 in the second protective switch are connected in series between the high feed voltage VDD and the control input of the transistor MP10 at 7. A first transistor MP9 of the transistors in the second protective switch has its control input connected to the output stage output at 10.

The short circuit protector of the transistor MN10 is arranged to come into operation when the input signal to the circuit at 2 has comparatively high potential simultaneously as the output stage output is short circuited to a higher feed voltage, or the output OUT dives a too low ohmic load connected to the high feed voltage. Without the short circuit protector, the first control stage would then drive the control signal to the transistor MN10 at 4 to a comparatively high potential so that the transistor MN10 was conductive. The short circuit or the two low ohmic load to the high feed voltage achieves, however that the potential on the output stage output at 10 will be higher than normal. This higher level affects the conductivity of the first protection transistor MN6 in the first protective circuit, since the control electrode of the transistor is connected to the output stage output. The transistor MN6 begins to be conductive when the voltage between the circuit output at 10 and VSS becomes greater than the threshold voltage for this transistor. Furthermore, the circuit input signal at 2 via the input stage and the first further control stage achieve a comparatively high potential on the control stage output of the first further control stage at 5 The high potential at 5, in combination with a sufficiently high potential at 10, achieves that both series connected protection transistors MN46 and MN6 begin to be conductive, which in turn lead to a lowering of the potential at 4 by a current beginning to flow from VDD through MP4, MN46 and MN6 to VSS. The lowering of the potential at 4 leads to a reduction of the conductivity of the transistor MN10, which in turn reduces the current through this transistor.

In order that the short circuit protector for the transistor MN10 will function in the intended way there is required a certain combination of the voltages at 5 and 10. Merely a high potential at the output stage output at 10, which could control the protection transistor MN6 to a conductive stage is thus not sufficient for the short circuit protector to the transistor MN10 shall come into operation. How much the short circuit protector limits the current through the transistor MN10 depends on how much the potential on the control input of the transistor MN10 at 4 is lowered when both MN46 and MN6 are conductive. How much this potential is lowered depends on the mutually relative magnitudes of the voltage drop across MP4 and the volage drop across MN46 and MN6, when all three transistors are conductive, i.e. on how the transistors MN46 and MN6 are dimensioned in relation to the transistor MP4. It should be noted that the short circuit protector in the present case gradually comes into operation when the potential on the circuit output is forced towards the feed voltage corresponding to short circuiting. The protector thus functions best for short circuiting, but even for overloading.

The short circuit protector for the transistor MP10 is arranged to come into operation when the input signal to the circuit at 2 has comparatively low potential, simultaneously as the output stage output at 10 is either short circuited to a lower feed voltage, e.g. VSS, or drives a too low ohmic load connected to the lower feed voltage. Without the short circuit protector, the second control stage would then drive the control signal to the transistor MP10 at 7 to a comparatively low potential so that the transistor MP10 becomes conductive. The short circuit or the too low ohmic load to the lower feed voltage achieves, however, the the potential at the output stage output at 10 becomes abnormally low This low potential affects the conductivity of the first protective switch component MP9 in the second protective circuit, since the control electrode of the transistor MP9 is connected to the output stage output. In addition, the circuit input signal at 2 achieves, via the input stage and the second further control stage, a comparatively low potential on the control stage output of the second further control stage at 8. The low potential at 8 in combination with a sufficiently low potential at 10 achieves that both the two series connected transistors MP79 and MP9 begin to be conductive, which in turn leads to raising of the potential at 7 by current beginning to flow from VDD through MP9, MP79 and MN7 to VSS. Raising of the potential at 7 on the control electrode of the transistor MP10 leads to a reduction of the conductivity of the transistor MP10, which in turn reduces the current thr transistor. How much the short circuit protector limits the current through the transistor MP10 depends on how much the potential on the control input of the transistor MP10 at 7 is raised when MP9 and MP79 are conductive. How much this potential is raised depends in turn on the mutually relative magnitudes of the voltage drop across MN7 and the voltage drop across MP9 and MP79 when all these three transistors are conductive, i.e. on how the transistors MP9 and MP79 are dimensioned in relation to the transistor MN7.

It should be noted that the short circuit protector for the transistor MP10 first comes into operation when both transistors MP9 and MP79 become conductive. A certain combination of voltages at 8 and 10 are required for this.

Merely a low potential at the output of the output stage at 10, which could turn the protection transistor MP9 on, is thus not sufficient for the short circuit protector to the transistor MN10 coming into operation. It should also be noted that the short circuit protector for MP10 gradually comes into operation when the potential on the circuit output approaches the feed voltage corresponding to short circuiting. Although the protector thus operates best at short circuiting, it has thus a certain effect for overload also. There are thus combinations of the input signal potential at 2 to the circuit in FIG. 5 and the output potential at 10 from the circuit for which none of the protective switches or the further control stages needs to have any notable importance for the relationship between input and output signal levels.

The short circuit protected circuit illustrated in FIG. 6 includes an output stage having series connected transistors MN11 and MN10. The circuit output OUT is connected to the point 10 between the series connected transistors in the output stage. The circuit input IN at 2 is connected to the control electrodes of both transistors MP3 and MN3 at an input stage. The control input of the transistor MN11 is coupled directly to the output of the input stage at 3. On the other hand, for controlling the conductive capacity of the transistor MN10 there is a first control stage, including the transistors MP4 and MN4, coupled between the control input of the transistor MN10 at 4 and the input stage output at 3. As with the circuit according to FIG. 5, the short circuit protector for the transistor MN10 includes: (a) a first protective circuit or stage with two series connected transistors MN46 and MN6, (b) a first further control stage with two series connected transistors MP5 and MN5.

The first further control stage output is connected at 5, similarly to the circuit in FIG. 5, to the control input of the transistor MN46 and the output stage output at 10 to the control input of the transistor MN6. This short circuit protector for the transistor MN10 in the circuit illustrated in FIG. 6 is principly of the same implementation and mode of operation as the short circuit protector for the transistor MN10 in the circuit illustrated in FIG. 5, and should thus require no further description.

The short circuit protector for the transistor MN11 in FIG. 6 differs from that for the transistors MP10 and MN10 in FIGS. 5 and 6, and principally solely comprises a series resistor R coupled between the high feed voltage VDD and the transistor MN11. It will be understood at once by one skilled in the art that a series resistor with sufficiently high resistance coupled in such a manner can restrict the current through the transistor MN11. The greater the resistance, the less will be the short circuit current. However, the possible normal output level and the output current at high potential at the output stage output will be lower and lower the higher and higher the resistance is of the series resistor R. An upper limit for the resistance of it is given by the transistor MN11 not beginning to operate in its linear range when it conducts. A suitable resistance for R is therefore determined by the feed voltages VDD and VSS the dimensioning of the transistors MN10 and MN11, as well as the desired ranges of output voltages and output currents at the output state output during normal operation, i.e. without short circuiting or too low ohmic load.

As with dimensioning of the series resistor R, the implementation of the short circuit protectors for the transistors MN10 and MP10 should be carried out so that they do not disturb, or at least only insignificantly disturb the normal function of the circuit. The short circuit protectors should thus not come into operation unnecessarily, and their action should cease when it is no longer needed, e.g. because the short circuit state has ceased.

In order that, for example, the short circuit protector for the transistor MN10 will not come into operation in normal operation in conjunction with the input signal to the circuit at 2 going from low to high level, the potential at the output stage output at 10 must be low before the potential on the stage output from the first further control stage at 5 becomes high. In this way, due to the switchover, both MN46 and MN6 namely cannot be temporarily conductive simultaneously. If, instead, the potential at 5 manages to become high before the potential on the output at 10 manages to become low, then both MN46 and MN6 become conductive for a short time, which lowers the potential on the control input at 4 of the transistor MN10, whereby the changeover on the output stage output from high to low potential is delayed.

The changeover from low to high potential at 5 should thus be comparatively slow or intentionally delayed. In integrated circuits in the MOS technique, this can be accomplished for example, by suitable dimensioning of the transistor MP5, which can be achieved by making its width sufficiently small in relation to its length.

In order that the short circuit protector for the transistor MN10 shall not come into operation in normal operation in conjunction with the input signal to the circuit at 2 changing over from high to low level, the transistor MN5 shall be dimensioned for analoguous reasons, so that the switchover from high to low level at 5 takes place rapidly, since the potential at 5 must manage to become low before the potential at 10 is allowed to become high.

In order that the short circuit protector for the transistor MP10 in FIG. 5, for example shall not come into operation in conjunction with the signal to the circuit at 2 changing over from high to low level, the changeover from high to low potential at 8 should be comparatively slow or intentionally delayed in a corresponding way, which similarly can be achieved by making the width of the transistor MN8 sufficiently small in relation to its length. In order that the short circuit protector for the transistor MP10 in FIG. 5 shall not come into operation in conjunction with the input signal to the circuit at 2 changing over from low to high level, the transistor MP8 must be dimensioned analogously with MN5.

Should the control stages optionally deviate from those illustrated in FIG. 5, the generally applicable condition is that the respective control stage and further control stage should be implemented so that the changes in potential on the respective stage output, which will be the result of changes of the potential of the input signal on the circuit input, occur earlier or later on the output of a control stage than on the output of the corresponding further control stage, in response to the change in direction of the input signal potential.

After a short circuit protector for the transistor MN10 has come into operation, the circuit should return to normal operation when the short circuit to the high feed voltage ceases, or the load returns to permitted values. In such a case, the transistor MN10 must be able to drive the circuit output to low potential within the framework of permitted loading, and with the control signal at 4 still at a lowered potential. This means that there is a minimum permitted potential at 4 in conjunction with short circuiting, and thus a maximum permitted driving capacity of the combination of transistors MN46 and MN6.

In a corresponding way, the circuit in FIG. 5 should return to normal function after the short circuit protector for the transistor MP10 in FIG. 5 has come into operation when the short circuit to the low feed voltage, e.g. VSS ceases or the load returns to permitted values. In such a case, the transistor MP10 must drive the output of the circuit at 10 to high potential within the framework for permitted loading, and with the control signal at 7 still at an increased potential. This means that there is a maximum permitted potential at 7 in conjunction with short circuiting, and thus a maximum permitted driving capacity of the combination of transistors MP9 and MP79.

The invention is not limited to the two embodiments in FIGS. 5 and 6, but other embodiments are conceivable with respective components implemented either in MOS or bipolar technique, or in a combination of both. The invention is not limited to integrated circuits, even though these are the most natural field of application. It is even conceivable to apply the invention in connection with certain components with controllable conductive capacity other than transistors. Neither the input stage nor the control stages need necessarily completely agree in both embodiment and number with what is illustrated in FIGS. 5 and 6. The feed voltages VDD and VSS shall of course be different but it is not absolutely necessary that one is positive and the other negative, but one of them can have ground potential. The main thing is that in circuits according to FIGS. 1–6, VDD has an appropriately higher potential than VSS. Although it is usually advantageous to have the same feed voltages for all stages in the circuits, not least in integrated circuits of the CMOS type, it is also conceivable in certain cases to have a deviating special feed voltage for some given stage e.g. the feed voltage VDD for the output stage in the circuit according to FIG. 6. The circuit or circuits connected to the output OUT, and through which short circuiting or overloading can occur, may of course be supplied with current via other feed voltages than VDD and VSS. Further modifications are conceivable within the scope of the claims. Furthermore, although indeed not to be preferred, it is at least conceivable to replace two series connected transistors in a protective circuit with a single protective transistor or the like, controlled by the potentials of both input signal and output potential via a logical network or the like. When the circuit optionally deviates from the one illustrated in FIG. 5, the general condition applicable is that the respective control stage and further control stage should be implemented and coupled into the circuit, such that the changes of potential on the respective stage output will be the result of changes in the potential in a given direction of the input signal on the circuit input, occurring earlier on the output of a control stage than on an output of a corresponding further control stage. In addition, the control stages shall be implemented and coupled into the circuit so that the changes of potential on the respective stage output, which will be the result of changes of potential in the opposite direction to the above mentioned "given" directions of the input signals on the circuit output, will occur later on a control stage output than on the stage output of a corresponding further control stage.

I claim:

1. An overcurrent-protected buffer circuit comprising:

two series-connected output stage components generating a circuit output signal at a circuit output between them, the potential of the output signal corresponding to a circuit input signal at a circuit input, the conductive capacity of the output stage components being individually controlled via individual component control inputs of the respective output stage components;

a first control stage controlled by the circuit input signal, said first control stage having a first control stage output connected to a component control input of a first of the two series-connected output stage components; and overcurrent protectors for at least the first output stage component, including a first protective circuit, said first protective circuit further comprising:

a first of two series-connected protective switch components having a conductive capacity controlled via a component control input coupled to the circuit output, controlling the conductive capacity of the first protective switch component in response to the potential on the circuit output, said first protective switch component being placed in its conductive stage solely when the potential on the circuit output substantially deviates, as a consequence of overloading or short circuiting the output, from the potential on the circuit output when overloading or short circuiting are not present and the deviation has a direction signifying current increase through the first output stage component; and a second series-connected protective switch component having a conductive capacity controlled by a component control input responsive to the circuit input signal, and being placed in its conductive state solely when the circuit input signal is such that the first output stage component is to be conducting, generating the intended circuit output signal corresponding to the circuit input signal;

wherein said first protective circuit is coupled to the first control stage so that only when both its protective switch components are placed in a conductive stage does the protective circuit form a conductive current path which substantially affects the potential on the output of the first control stage and the component control input of the first output stage component in a direction such that the conductive capacity of the first output stage component is substantially reduced.

2. A circuit as claimed in claim 1, further comprising: a first further control stage included in the overcurrent protector for the first output stage component having a control stage output connected to the component control input of the second protective switch component and a control stage input connected for controlling the first further control stage in response to the circuit input signal, such that the conductive capacity of the second protective switch component of the first protective circuit is controlled in response to the circuit input signal via the first further control stage.

3. A circuit as claimed in claim 2, further comprising an overcurrent protector for the second output stage component, including:

a first of two series-connected protective switch components having a conductive capacity controlled via a component control input coupled to the circuit output, controlling the conductive capacity of the first protective switch component in response to the potential on the circuit output, said first protective switch component being placed in its conductive state solely when the potential on the circuit output substantially deviates, as a consequence of overloading or short circuiting the output, from the potential on the circuit output when overloading or short circuiting are not present and the deviation has a direction signifying current increase through the second output stage component;

a second series-connected protective switch component having a conductive capacity controlled by a component control input responsive to the circuit input signal, and being placed in its conductive state solely when the circuit input signal is such that the second output stage component is to be conducting, generating the intended circuit output signal corresponding to the circuit input signal; and a second control stage controlled by the circuit input signal, said second control stage having a second control stage output connected to a component control input of the second output stage component;

wherein said second protective circuit is coupled to the second control stage so that only when both its protective switch components are placed in a conductive state does the protective circuit form a conductive current path which substantially affects the potential on the output of the second control stage and the component control input of the second output stage component in a direction such that the conductive capacity of the second output stage component is substantially reduced.

4. A circuit as claimed in claim 3, further comprising: a second further control stage, which has a control stage output connected to the component control input of the second protective switch component of the second protective circuit, and a control stage input connected for controlling the second further control stage in response to the circuit input signal, so that the conductive capacity of the second protective switch component of the second protective circuit is controlled in response to the circuit input signal via the second further control stage.

5. A circuit as claimed in claim 4, in which the respective control stages are implemented and coupled into the circuit such that the changes of the potential of the respective stage output, which will be the result of changes of the potential of the input signal on the circuit input, occur earlier or later on the stage output of a control stage than on the stage output of a corresponding further control stage in response to the change in direction of the potential of the input signal.

6. A circuit as claimed in claim 1, further comprising an overcurrent protector for the second output stage component, including:

a first of two series-connected protective switch components having a conductive capacity controlled via a component control input coupled to the circuit output, controlling the conductive capacity of the first protective switch component in response to the potential on the circuit output, said first protective switch component being placed in its conductive state solely when the potential on the circuit output substantially deviates, as a consequence of overloading or short circuiting the output, from the potential on the circuit output when overloading or short circuiting are not present and the deviation has a direction signifying current increase through the second output stage component;

a second series-connected protective switch component having a conductive capacity controlled by a component control input responsive to the circuit input signal, and being placed in its conductive stage solely when the circuit input signal is such that the second output stage component is to be conducting, generating the intended circuit output signal corresponding to the circuit input signal; and a second control stage controlled by the circuit input signal, said second control stage having a second control stage output connected to a component control input of the second output stage component;

wherein said second protective circuit is coupled to the second control stage so that only when both its protective switch components are placed in a conductive state does the protective circuit form a conductive current path which substantially affects the potential on the output of the second control stage and the component control input of the second output stage component in a direction such that the conductive capacity of the second output stage component is substantially reduced.

7. A circuit as claimed in claim 6, further comprising: a second further control stage, which has a control stage output connected to the component control input of the second protective switch component of the second protective circuit, and a control stage input connected for controlling the second further control stage in response to the circuit input signal, so that the conductive capacity of the second protective switch component of the second protective circuit is controlled in response to the circuit input signal via the second further control stage.

8. A circuit as claimed in claim 7, in which the respective control stages are implemented and coupled into the circuit such that the changes of the potential of the respective stage output, which will be the result of changes of the potential of the input signal on the circuit input, occur earlier or later on the stage output of a control stage than on the stage output of a corresponding further control stage in response to the change in direction of the potential of the input signal.

9. A circuit as claimed in claim 1, in which the control stage and the output stage include two control stage components with controllable conductive capacity connected in series between a first (VDD) high feed voltage and a second (VSS) low feed voltage, and in which the two protective switch components in the protective circuit are series-connected between one of the feed voltages (VDD or VSS) and the component control input of the output stage component.

10. A circuit as claimed in claim 9, in which the control stage is implemented and coupled into the circuit such that the changes of the potential of the stage outputs, which will be the result of changes of the potential of the input signal on the circuit input, occur earlier or later on the stage output of a control stage than on the stage output of a corresponding further control stage in response to the change in direction of the potential of the input signal.

11. A circuit as claimed in claim 10, in which an input stage with a stage input constitutes the circuit input and a stage output is connected to the input of the control stage.

12. A circuit as claimed in claim 11, in which the components with controllable conductive capacity are transistors implemented in MOS technique.

* * * * *